US006166779A

United States Patent [19]

[11] Patent Number: 6,166,779

[45] Date of Patent: Dec. 26, 2000

Kokudo et al.

[54] METHOD FOR ANALOG DECIMATION OF IMAGE SIGNALS

[75] Inventors: Shingo Kokudo, Ushiku Ibaraki, Japan; Jonathan A. Kleks, Sunnyvale; Ion E. Opris, Cupertino, both of Calif.

[73] Assignee: NuCore Technology Inc., Santa Clara, Calif.

[21] Appl. No.: 09/300,816

[22] Filed: Apr. 27, 1999

[51] Int. Cl.$^{7}$ .............................. H04N 5/52; H04N 5/335

[52] U.S. Cl. ............................................ 348/572; 348/230

[58] Field of Search .................................... 348/572, 571, 348/625, 607, 221, 232, 230, 255, 257, 707, 441; 341/155, 172

[56] References Cited

U.S. PATENT DOCUMENTS 5,995,163 11/1999 Fossum .................................. 348/571

*Primary Examiner*—Victor R. Kostak

*Attorney, Agent, or Firm*—Townsend and Townsend and Crew LLP; Kenneth R. Allen

[57] ABSTRACT

In a digital image processing device such as a portable digital camera, an analog decimation circuit is provided as a front end for the digital video imaging circuit so that the data rate is reduced without substantial loss in fidelity so that the power dissipation is minimized. In a decimation circuit, the data rate is reduced by reducing only higher frequency spectral components of a captured image without substantial loss in fidelity of the remaining spectral components of the captured image. The required amount of digital data processing is so substantially reduced that considerable power savings result. A mixture of decimation modes may be effected using the same circuit.

12 Claims, 4 Drawing Sheets

METHOD FOR ANALOG DECIMATION OF IMAGE SIGNALS

BACKGROUND OF THE INVENTION

This invention relates to digital image processing for particular application to image capture in a portable digital video imaging device such as a camera.

There is a need to be able to capture images at a first sampling rate while providing an accurate representation of the sampled image to output elements at a second sampling rate. In particular, there is a need to reduce the data rate to output elements in order to decrease system power dissipation and data storage requirements in power and storage-sensitive applications, such as preview modes of images in digital cameras.

As the conventional analog signal processing systems are replaced by digital systems, many processes can be compromised to take advantage of inherent benefits of digital processing. For example, it is sometimes necessary to reduce the amount of data captured so that it can be processed efficiently and economically. Whereas sample rate reduction reduces the amount of data, the widespread use of digital processing in a signal processing system typically requires more power than comparable analog systems. Subsampling the input signal after the analog to digital conversion has the drawback of requiring high power dissipation in upstream analog to digital conversion subsystems that work at a higher clock rate. Subsampling at any stage reduces information content at the expense of signal fidelity, such as increased noise and coarser granularity in processed images.

What is needed is a technique for reducing the data rate in a digital image acquisition system while saving power and without a correspondingly large reduction in signal fidelity.

SUMMARY OF THE INVENTION

According to the invention, in a digital image processing device such as a portable digital camera, an analog decimation circuit is provided as a front end for the digital video imaging circuit so that the data rate is reduced without substantial loss in fidelity so that power dissipation is minimized. In a decimation circuit, the data rate is reduced by reducing only higher frequency spectral components of a captured image without substantial loss in fidelity of the remaining spectral components of the captured image. The required amount of digital data processing is so substantially reduced that considerable power savings result. A mixture of decimation modes may be effected using the same circuit.

The invention will be better understood by reference to the following detailed description in connection with the accompanying drawings.

DESCRIPTION OF THE SPECIFIC EMBODIMENTS

Figure 1:
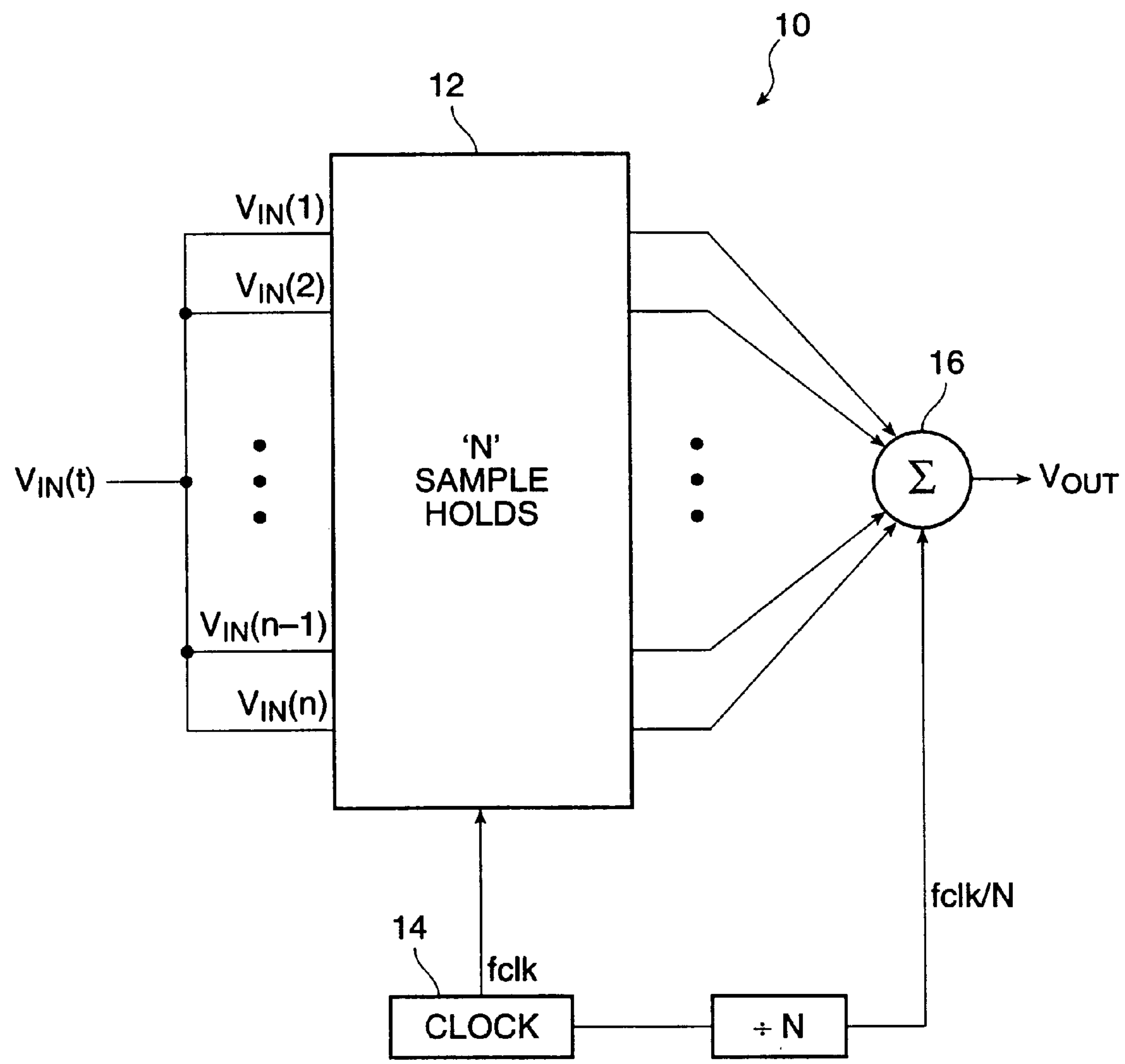
FIG. 1 is a block diagram of an analog decimation subsystem according to the invention.

Reference is made to FIG. 1, which shows a block diagram of a decimator 10 according to the invention. A plurality of video input paths Vin(1) through Vin(N) are coupled to a common video signal input Vin(t) and provide signals to N number of sample and hold amplifiers (S/H) 12, all of which are under control of a synchronous clock 14 having a clock rate of fclk. The outputs of the S/H amplifiers 12 are summed at a clocked summing amplifier 16, which itself is under synchronous control of clock 14. However it is clocked at a rate of fclk/N. The output is a sequentially clocked analog signal Vout suitable for direct conversion to a sequence of digital samples. The output signal at each output clock 1/N is an average over an N sample window.

Figure 2:
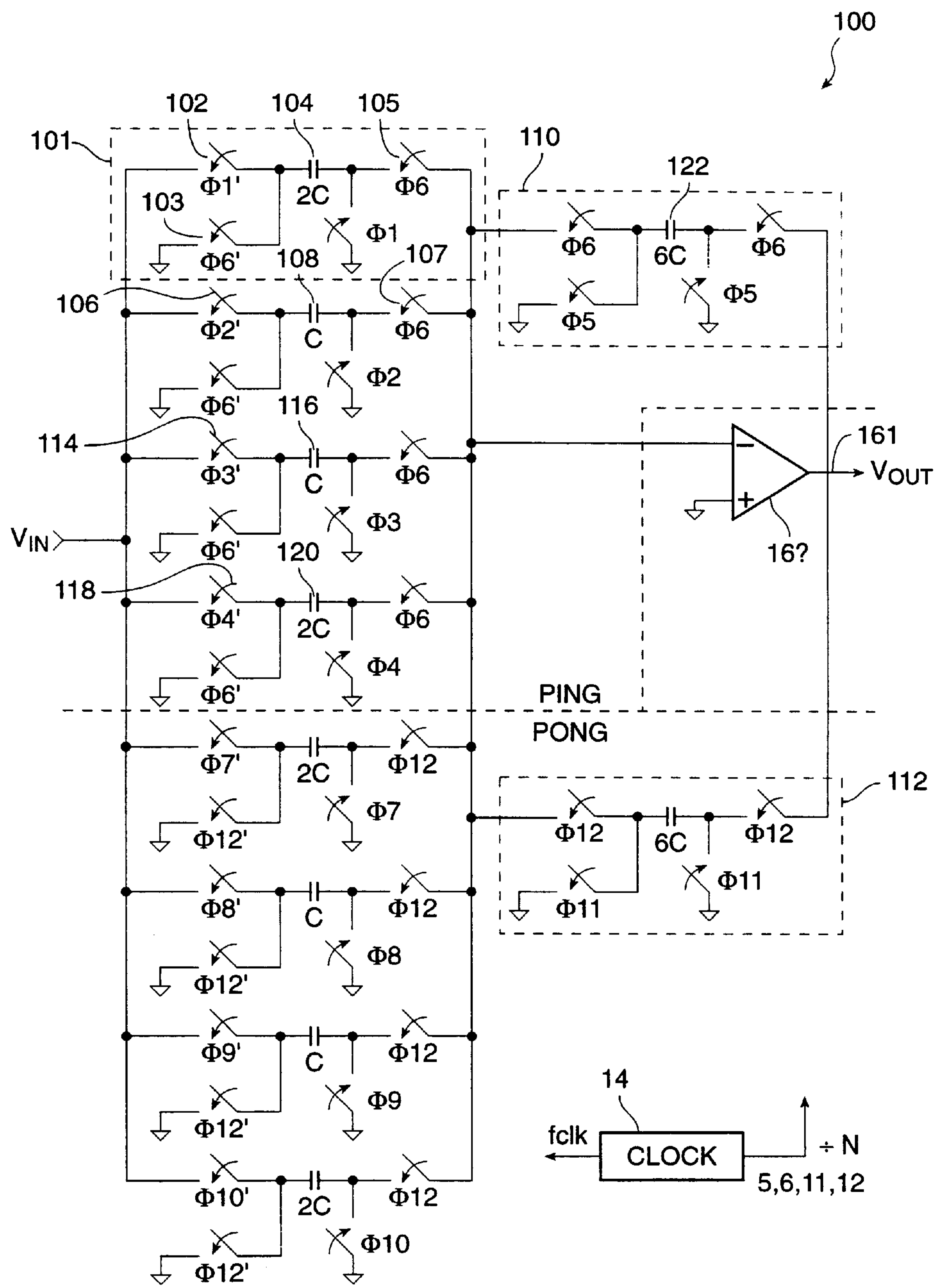
FIG. 2 is a circuit diagram of one form of analog decimation subsystem functional in both ⅓ and ½ decimation modes.

Referring to FIG. 2, there is shown an example of a programmable analog decimator 100 illustrating the principle of analog decimation and averaging using switched capacitors of value C and 2C. The reasoning behind this evident disparity of values will be apparent hereinafter. A plurality of sampling modules, as represented by sampling module 101, each includes a plurality of switches 102, 103, 105 and 107 and an analog value storage capacitor 104 of either value C or value 2C.

In this embodiment, ping-pong processing is employed such that two separate output signals are multiplexed in time and share a common output amplifier 160. While ping-pong processing is not a necessary element of the invention, it provides certain practical advantages. Ping-pong processing, among other advantages, allows extra settling time for the amplifier 160, reduces power dissipation, and avoids missing input data samples in the hold/amplify mode while the alternate bank is in the sampling mode.

With ping-pong processing, no input samples are missed, and settling time is adequate for a typical operational amplifier at the sampling rates of interest. In proper operation, phases Φ5 and Φ6 are nonoverlapping and phases Φ11 and Φ12 are nonoverlapping and the other phases of each set (respectively Φ1–Φ4; Φ7–Φ10) must have ended first.

In operation, the ping bank is controlled by switches with phases Φ1–Φ6, while the pong bank is controlled by switches with phases Φ7–Φ12. A first gating subsystem 110 and a second gating subsystem 112 alternately route the feedback signals and ultimately establish the stage gain. Reference is made to the timing diagrams of FIG. 3 and FIG. 4 for a more detailed understanding of operation of the circuit. According to the invention, ⅓ decimation and ½ decimation can be performed by the same sampling system by proper choice of capacitance values and phasing whereby parallel paths are selectively combined.

Figure 3:
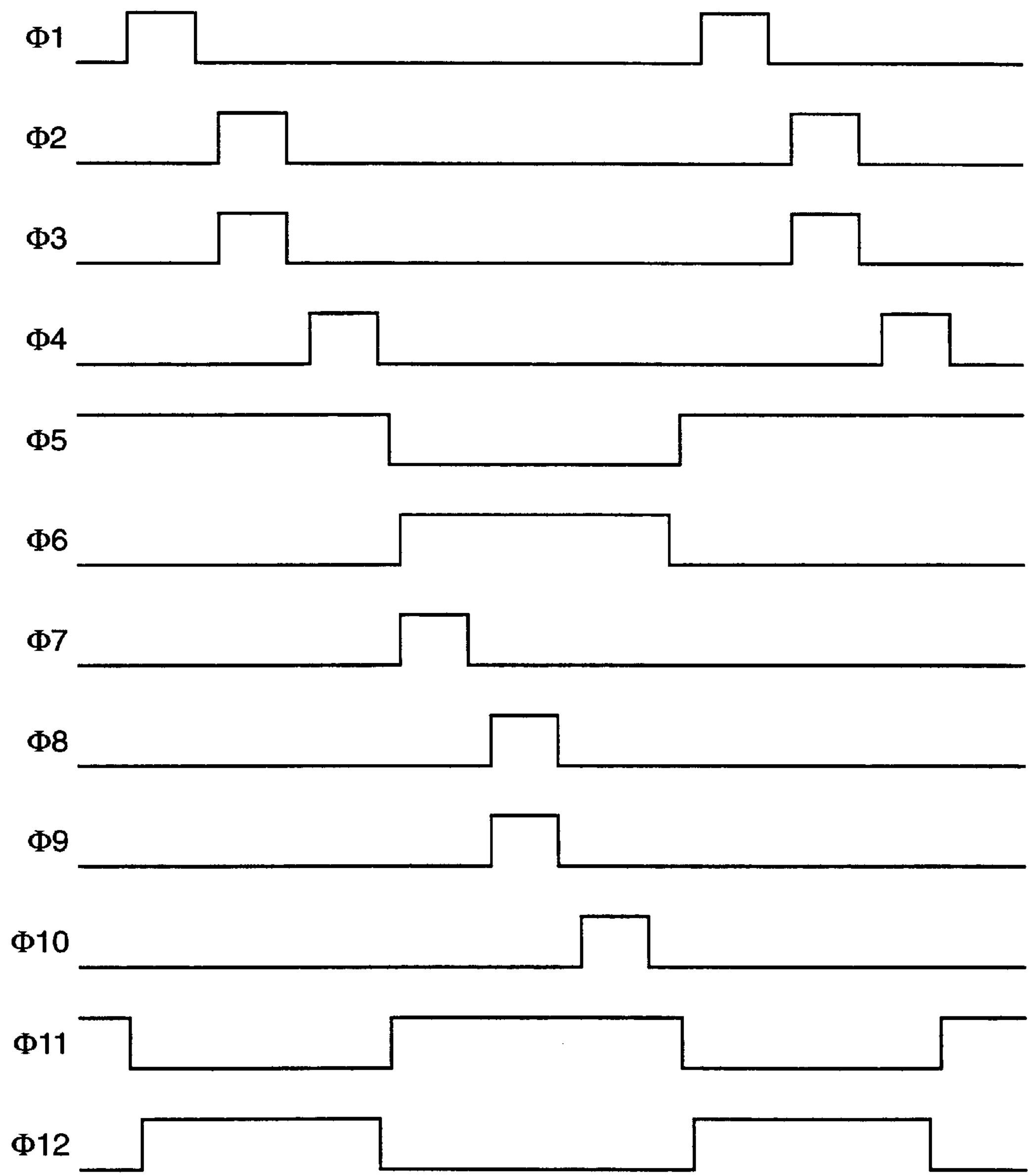
FIG. 3 is a timing diagram of an analog decimation process for 9 input samples in a ⅓ decimation mode.

FIG. 3 illustrates timing for analog decimation in the ⅓ decimation mode. The phases of the switches are indicated by the index on the term Φ. During a first set of phases, sampling takes place. During a second set of phases, signal averaging and decimation occur.

In the ping or even set of phases, the first analog input sample is stored on capacitor 104 during phase Φ1. During phase Φ2 (which is the same as phase Φ3 in ⅓ decimation mode), the second analog input sample is stored on capacitor 108 (and on capacitor 116 in ⅓ decimation mode). During phase Φ4, the third analog input sample is stored on capacitor 120. Phase Φ5 overlaps phases Φ1, Φ2, Φ3 and Φ4. Phase Φ5 is used to discharge the feedback capacitor 122 and prepare it for the subsequent averaging phase.

Phase Φ6 is used for averaging together the signal samples which were captured during phases Φ1, Φ2, Φ3 and Φ4. During phase Φ6, all of the sampling capacitors 104, 108, 116 and 120 are simultaneously switched into the input port of amplifier 160 to produce an output signal at output port 161 which is the sum of the charge on the capacitors 104, 108, 116 and 120 divided by the capacitance value on first feedback capacitor 122 in first gating subsystem 110, which has been enabled to provide feedback. In this embodiment the values of capacitors 104, and 120 are the same and are also equal to the sum of the values of capacitors 108 and 116. As a result, in this embodiment, the three input samples have equal weight in the output value. Moreover, the sum of all of the values of the sampling capacitors 104, 108, 116 and 120 is equal to the value of the feedback capacitor 122, yielding unity gain. In alternative embodiments, the weighting and the gain can be modified. to tailor the transfer characteristics.

A similar complementary set of phases is employed to process signal samples during the odd or pong phase set.

Figure 4:
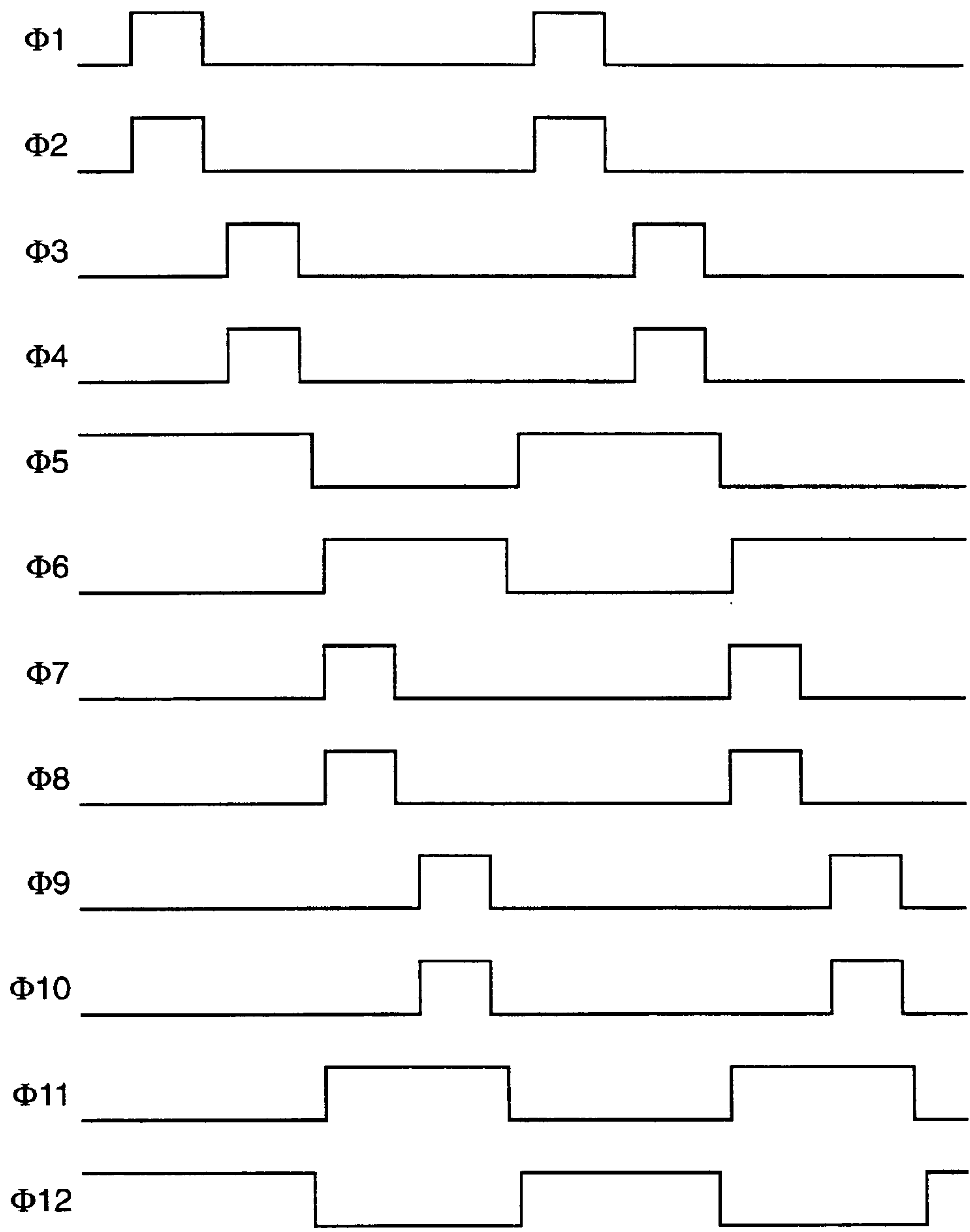
FIG. 4 is a timing diagram of an analog decimation process for 8 input samples in a ½ decimation mode.

One-half decimation mode processing operates as follows, as illustrated in FIG. 4.

During a first set of phases, sampling takes place. During a second set of phases, signal averaging and decimation occur.

In the ping or even set of phases, the first analog input sample is stored on capacitor 104 during phase Φ1 (and on capacitor 108 during phase Φ2 which is the same as phase Φ1). During phase Φ3 (which is the same as phase Φ4 in ½ decimation mode), the second analog input sample is stored on capacitor 116 (and on capacitor 120 in ½ decimation mode). Phase Φ5 overlaps phases Φ1, Φ2, Φ3 and Φ4. Phase Φ5 is used to discharge the feedback capacitor 122 and prepare it for the subsequent averaging phase.

Phase Φ6 is used for averaging together the signal samples which were captured during phases Φ1/Φ2, and Φ3/Φ4. During phase Φ6, all of the sampling capacitors 104, 108, 116 and 120 are simultaneously switched into the input port of amplifier 160 to produce an output signal at output port 161 which is the sum of the charge on the capacitors 104, 108, 116 and 120 divided by the capacitance value on first feedback capacitor 122 in first gating subsystem 110, which has been enabled to provide feedback. In this embodiment the values of capacitors 104, and 120 are the same and are also equal to the sum of the values of capacitors 108 and 116. As a result, in this embodiment, the two input samples have equal weight in the output value. Moreover, the sum of all of the values of the sampling capacitors 104, 108, 116 and 120 is equal to the value of the feedback capacitor 122, yielding unity gain. In alternative embodiments, the weighting and the gain can be modified. to tailor the transfer characteristics.

Similarly the capacitors in the pong portion of the circuit are activated in the odd set of phases.

It is noteworthy that the configuration of capacitors having values of 2C, C, C, 2C enables the implementation of both ⅓ decimation and ½ decimation modes with the same hardware. Only the timing of the clock 14 needs to be altered, which can be done as often as every other set of phases.

Selecting different values of capacitance for the sampling modules allows different averaging weights for the output samples, thus changing the transfer characteristics of the filter.

While only a single ended circuit is shown in FIG. 2, it should be understood that the circuit may be fully differential.

The invention has been explained with reference to specific embodiments. Other embodiments will be apparent to those of ordinary skill in the art. It is therefore not intended that this invention be limited, except as indicated by the appended claims.

What is claimed is:

1. An apparatus for processing sampled analog input signals of an image capture element, said apparatus comprising:

- a plurality of analog sample storage elements disposed in parallel paths;
- signal clocking means;
- first switching means for enabling selected ones of said analog sample storage elements to sample said analog input signals according to a first clocking signal of said signal clocking means synchronized with said sampled analog input signals;
- second switching means for averaging analog samples stored in said analog storage elements over an averaging period to obtain averaged a samples;
- and
- amplifier means for outputting said averaged a samples according to a second clock signal in order to provide output analog samples at a different rate than input samples, said different rate being an integer fraction of said first clocking signal.

2. The apparatus according to claim 1 wherein said analog sample storage elements are switched capacitors.

3. An apparatus for processing sampled analog input signals of an image capture element, said apparatus comprising:

- a plurality of analog sample storage elements disposed in parallel paths;
- signal clocking means;
- first switching means for enabling selected ones of said analog sample storage elements to sample said analog input signals according to a first clocking signal of said signal clocking means synchronized with said sampled analog input signals;
- second switching means for averaging analog samples stored in said analog storage elements over an averaging period to obtain averaged samples;
- and
- amplifier means for outputting said averaged samples according to a second clock signal in order to provide output samples at a different rate than input samples, said different rate being an integer fraction of said first clocking signal wherein said amplifier means is an analog output operational amplifier in a gain stage whose amplification is established by a ratio of capacitance values.

4. An apparatus for processing sampled analog input signals of an image capture element, said apparatus comprising:

- a plurality of analog sample storage elements disposed in parallel paths;
- signal clocking means;
- first switching means for enabling selected ones of said analog sample storage elements to sample said analog input signals according to a first clocking signal of said signal clocking means synchronized with said sampled analog input signals;
- second switching means for averaging analog samples stored in said analog storage elements over an averaging period to obtain averaged samples;
- and
- amplifier means for outputting said averaged samples according to a second clock signal in order to provide output samples at a different rate than input samples, said different rate being an integer fraction of said first clocking signal wherein said analog sample storage elements are switchably combined to establish a selectable gain for each input sample.

5. The apparatus according to claim 4 wherein said selectable gain is uniform for each different input sample, and wherein said first switching means is alterable between a first decimation rate and a second decimation rate while maintaining said uniform gain.

6. The apparatus according to claim 4 wherein said selectable gain is customized for each different input sample, thereby to alter transfer characteristics of said averaging function.

7. An apparatus for processing sampled analog input signals of an image capture element, said apparatus comprising:

a plurality of analog sample storage elements disposed in parallel paths;

signal clocking means;

first switching means for enabling selected ones of said analog sample storage elements to sample said analog input signals according to a first clocking signal of said signal clocking means synchronized with said sampled analog input signals;

second switching means for averaging analog samples stored in said analog storage elements over an averaging period to obtain averaged samples;

amplifier means for outputting said averaged samples according to a second clock signal in order to provide output samples at a different rate than input samples, said different rate being an integer fraction of said first clocking signal; and a first gating subsystem and a second gating subsystem, wherein said analog storage elements is allocated between a first processing phase and a second processing phase such that said first processing phase is sampling while said second processing phase is averaging and said first processing phase is averaging while said second processing phase is sampling.

8. A method for processing sampled analog input signals of an image capture element, said method comprising:

enabling selected ones of a plurality of analog sample storage elements disposed in parallel paths to sample said analog input signals according to a first clocking signal of a signal clocking means synchronized with said sampled analog input signals;

averaging analog samples stored in said analog storage elements over an averaging period to obtain averaged second, samples; and outputting said averaged analog samples according to a second clock signal in order to provide output samples at a different rate than input samples, said different rate being an integer fraction of said first clocking signal.

9. A method for processing sampled analog input signals of an image capture element for subsequent digital processing, said method comprising:

enabling selected ones of a plurality of analog sample storage elements disposed in parallel paths to sample said analog input signals according to a first clocking signal of a signal clocking means synchronized with said sampled analog input signals;

averaging analog samples stored in said analog storage elements over an averaging period to obtain averaged samples; and outputting said averaged samples according to a second clock signal in order to provide output samples at a different rate than input samples, said different rate being an integer fraction of said first clocking signal, wherein said sampling step includes switchably combining said analog sample storage elements to establish a selectable gain for each input sample.

10. The method according to claim 9 wherein said sampling step includes switching said first switching means alternately between a first decimation rate and a second decimation rate while maintaining said uniform gain.

11. A method for processing sampled analog input signals of an image capture element for subsequent digital processing, said method comprising:

enabling selected ones of a plurality of analog, sample storage elements disposed in parallel paths to sample said analog input signals according to a first clocking signal of a signal clocking means synchronized with said sampled analog input signals;

averaging analog samples stored in said analog storage elements over an averaging period to obtain averaged samples; and outputting said averaged samples according to a second clock signal in order to provide output samples at a different rate than input samples, said different rate being an integer fraction of said first clocking signal, wherein said sampling step includes customizing said selectable gain for each different input sample, thereby to alter transfer characteristics of said averaging function.

12. A method for processing sampled analog input signals of an image capture element for subsequent digital processing, said method comprising:

enabling selected ones of a plurality of analog sample storage elements disposed in parallel paths to sample said analog input signals according to a first clocking signal of a signal clocking means synchronized with said sampled analog input signals;

averaging analog samples stored in said analog storage elements over an averaging period to obtain averaged samples; and outputting said averaged samples according to a second clock signal in order to provide output samples at a different rate than input samples, said different rate being an integer fraction of said first clocking signal;

further including a first gating subsystem and a second gating subsystem, further including the steps of:

allocating said analog storage elements between a first processing phase and a second processing phase such that said first processing phase is sampling while said second processing phase is averaging and said first processing phase is averaging while said second processing phase is sampling.

* * * * *